United States Patent
Stenestam

(10) Patent No.: US 10,742,019 B2
(45) Date of Patent: Aug. 11, 2020

(54) MONITORING TAP CHANGER SWITCHING

(71) Applicant: ABB Power Grids Switzerland AG, Baden (CH)

(72) Inventor: Bengt-Olof Stenestam, Ludvika (SE)

(73) Assignee: ABB Power Grids Switzerland AG, Baden (CH)

(*) Notice: Subject to any disclaimer, the term of this patent is extended or adjusted under 35 U.S.C. 154(b) by 0 days.

(21) Appl. No.: 16/349,275

(22) PCT Filed: Oct. 31, 2017

(86) PCT No.: PCT/EP2017/077873
§ 371 (c)(1),
(2) Date: May 12, 2019

(87) PCT Pub. No.: WO2018/095703
PCT Pub. Date: May 31, 2018

(65) Prior Publication Data
US 2019/0288503 A1    Sep. 19, 2019

(30) Foreign Application Priority Data
Nov. 22, 2016 (EP) ..................... 16200009

(51) Int. Cl.
*H02H 5/04* (2006.01)
*H02H 5/06* (2006.01)
(Continued)

(52) U.S. Cl.
CPC ............ *H02H 7/055* (2013.01); *G01R 31/62* (2020.01); *H01F 29/02* (2013.01); *H01F 29/04* (2013.01);
(Continued)

(58) Field of Classification Search
CPC .... H02H 7/055; H02H 1/0007; H01H 9/0005; H01F 29/02; G01R 31/027
(Continued)

(56) References Cited

U.S. PATENT DOCUMENTS 7,089,145 B2   8/2006 Stenestam et al.
7,417,411 B2   8/2008 Hoffman et al.
(Continued)

FOREIGN PATENT DOCUMENTS

CA    2946483 A1   1/2016
EP    2409398 A2   1/2012
(Continued)

OTHER PUBLICATIONS

European Extended Search Report Application No. 16200009.5 Completed: Mar. 24, 2017 8 Pages.
(Continued)

*Primary Examiner* — Thienvu V Tran
*Assistant Examiner* — Lucy M Thomas
(74) *Attorney, Agent, or Firm* — Sage Patent Group

(57) ABSTRACT

The present disclosure relates to a method of monitoring switching by an on-load tap changer (OLTC) 1 from a first contact 3a to a second contact 3b of a transformer winding 2. The method includes measuring a voltage of the transformer. The method also includes measuring a temperature of the OLTC. The method also includes, based on the measured voltage and temperature, determining whether the switching from the first contact to the second contact has been successful.

17 Claims, 4 Drawing Sheets

(51) Int. Cl.
*H02H 7/04* (2006.01)
*H02H 7/055* (2006.01)
*H01F 29/02* (2006.01)
*H01H 9/00* (2006.01)
*H02H 1/00* (2006.01)
*H01F 29/04* (2006.01)
*G01R 31/62* (2020.01)

(52) U.S. Cl.
CPC ........ *H01H 9/0005* (2013.01); *H02H 1/0007* (2013.01); *H01H 2009/0061* (2013.01)

(58) Field of Classification Search
USPC .......................................................... 361/37

See application file for complete search history.

(56) References Cited

U.S. PATENT DOCUMENTS

| | | |
|---|---|---|
| 7,444,266 B2 | 10/2008 | Stenestam et al. |
| 2004/0021449 A1 | 2/2004 | Stenestam et al. |
| 2016/0352096 A1* | 12/2016 | Sachsenhausen ........ H02H 7/04 |

FOREIGN PATENT DOCUMENTS

| | | |
|---|---|---|
| EP | 2466322 A1 | 6/2012 |
| EP | 2541572 A1 | 1/2013 |
| JP | H04196403 A | 7/1992 |
| JP | 2003100529 A | 4/2003 |

OTHER PUBLICATIONS

International Search Report & Written Opinion of the International Searching Authority Application No. PCT/EP2017/077873 completed: Jan. 19, 2018; dated Feb. 2, 2018 17 Pages.

* cited by examiner

US 10,742,019 B2

MONITORING TAP CHANGER SWITCHING

TECHNICAL FIELD

The present disclosure relates to a method of monitoring switching by an on-load tap changer (OLTC) from a first contact to a second contact of the transformer winding taps.

BACKGROUND

A transformer tap is a connection point along a transformer winding that allows a certain number of turns to be selected. This means, a transformer with a variable turns ratio is produced, enabling voltage regulation of the output. The tap selection is made via a tap changer mechanism. The tap changer is a device comprising a tap selector and a diverter switch which is able to move fast between different contacts, where transition resistors are used to mitigate the transition state when the switch moves between different contacts when the tap changer is on-load (without halting the operation of the transformer). The tap-changer can also be designed with the diverter switch and tap selector combined (selector switch type).

There is a need to detect whether the tap changer has successfully switched to the new contact, or if the tap changer has e.g., gotten stuck during the transition between contacts. If a fault due to unsuccessful switching is detected, the transformer may be tripped and thus disconnected. However, to trip the transformer is costly and it may take some time to get it online again. It is thus important to not trip the transformer unless necessary.

SUMMARY

It is an objective of the present invention to provide an improved way of determining whether switching of a tap changer between contacts of a transformer winding has been successful or not.

According to an aspect of the present invention, there is provided a method of monitoring switching by an OLTC from a first contact to a second contact of a transformer winding. The method comprises measuring a voltage of the transformer. The method also comprises measuring a temperature of the OLTC. The method also comprises, based on the measured voltage and temperature, determining whether the switching from the first contact to the second contact has been successful.

According to another aspect of the present invention, there is provided a computer program product comprising computer-executable components for causing a controller of the tap changer to perform an embodiment of the method of the present disclosure when the computer-executable components are run on processing circuitry comprised in the controller.

According to another aspect of the present invention, there is provided a controller for monitoring switching by an OLTC from a first contact to a second contact of a transformer winding. The controller comprises processing circuitry, and storage storing instructions executable by said processing circuitry whereby said controller is operative to measure a voltage of a transformer. The controller is also operative to measure a temperature of an OLTC of the transformer. The controller is also operative to, based on the measured voltage and temperature, determine whether switching from a first contact to a second contact of a winding of the transformer has been successful.

By basing the determination of whether the switching has been successful or not on both the measured voltage and the measured tap changer temperature, a higher accuracy in the determination is obtained and the risk of unnecessarily tripping the transformer is reduced. Also, occasions where the tap changer appears to be in a correct position based on the measured voltage, but the switching is in reality incomplete, can be identified by means of embodiments of the present invention.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc., for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Figure 1A:
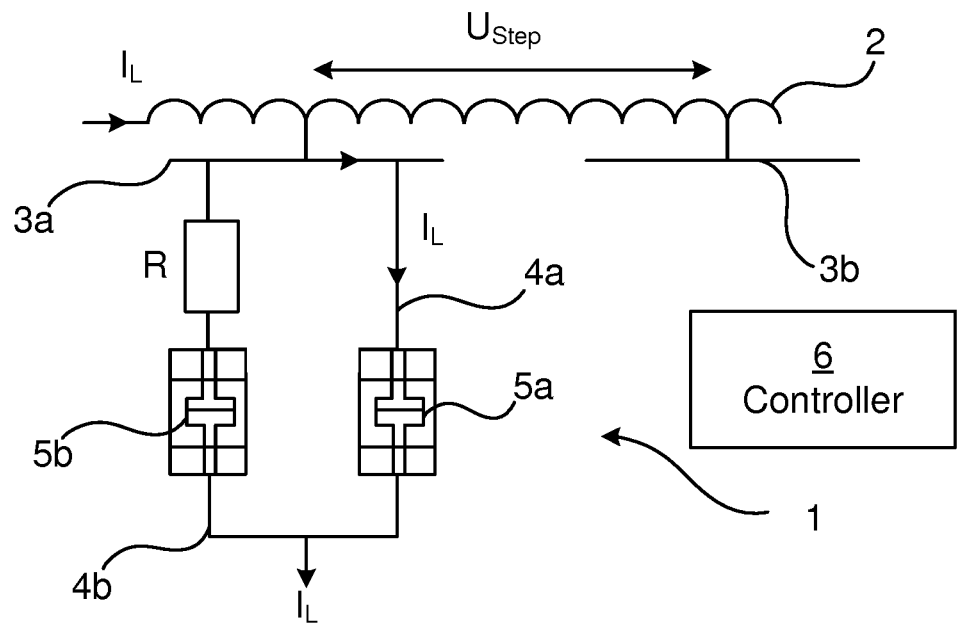
FIG. 1a is a schematic circuit diagram of an embodiment of a tap changer in a first transition step, in accordance with the present invention.

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

FIGS. 1a-d illustrates different steps in switching of a tap changer 1, typically an on-load tap-changer (OLTC), when a transition switch of the tap changer transitions from a first contact 3a to a second contact 3b for different taps on the winding 2 of a transformer, on a primary or secondary side of the transformer. The transformer winding 2 may have any number of contacts 3, each corresponding to a tap of the winding. The tap changer 1, typically a simplified transition switch thereof, comprises a first branch 4a having a first circuit breaker 5a, here in the form of a Vacuum Interrupter (VI). The first branch 4a is the main conductor for current $I_L$ through the winding 2 when the tap changer is properly positioned in relation to the contact 3 of the tap which is currently used. The tap changer also comprises a second branch 4b, which may have a second circuit breaker 5b, which second branch comprises a transition resistor R. When the first branch 4a is properly connected to a contact 3 and the circuit breaker 5a is closed, the resistor R typically restricts current from being conducted via the second branch. The second branch 4b is configured to conduct current of the winding 2 when the first branch 4a is disconnected from the contacts 3 and/or when the first circuit breaker 5a is open and in the bridging position (see FIG. 1d). When current is forced to pass through the second branch 4b, and thus through the resistor R, heat is generated in said resistor, resulting in a temperature increase in the tap changer 1. Typically, the tap changer is filled with an electrically insulating fluid, e.g., a liquid such as a mineral or vegetable oil or an ester liquid, which may also function as a cooling fluid. This cooling fluid may thus increase in temperature as it takes up heat generated in the resistor R. The temperature of the cooling fluid may be measured by means of a temperature sensor in the fluid-filled tap changer.

The tap changer 1 is monitored and/or controlled by means of a controller 6. The controller may be comprised in a control unit of the transformer, e.g., in a control room, or be distributed to a more specific control unit of the tap changer, which may also be located in a control room. The controller 6 comprises processing circuitry for executing components/instructions, typically in the form of software, stored in a storage unit in the controller. The processing circuitry may e.g., comprise a central processing unit (CPU). The processing circuitry may comprise one or a plurality of processing units in the form of microprocessor(s). However, other suitable devices with computing capabilities could be comprised in the processing circuitry, e.g., an application specific integrated circuit (ASIC), a field programmable gate array (FPGA) or a complex programmable logic device (CPLD). The storage is regarded as a computer program product as discussed herein and may e.g., be in the form of a Random Access Memory (RAM), a Flash memory or other solid state memory, or a hard disk, or be a combination thereof, holding a computer program.

In FIG. 1a, the tap changer 1 is connected to the first contact 3a for regular operation via the tap of said first contact. The tap changer is thus depicted as it is arranged before the tap changer starts to switch to the second contact 3b. The load current $I_L$ of the winding 2 passes through the first branch 4a via the closed first circuit breaker 5a, as indicated by arrows. The change in voltage $U_{step}$ between the first contact 3a and the second contact 3b is illustrated.

Figure 1B:
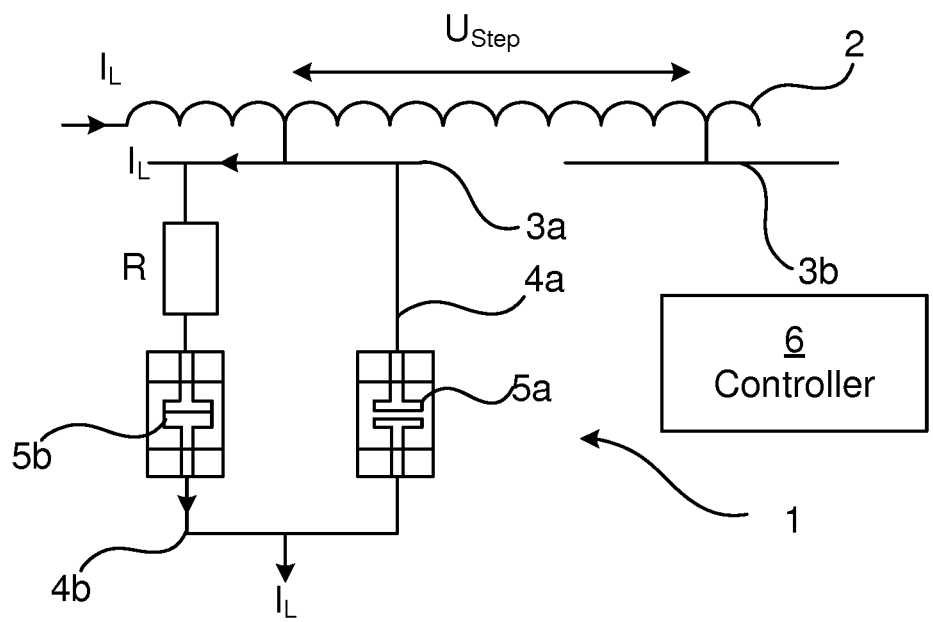
FIG. 1b is a schematic circuit diagram of the embodiment of a tap changer in a second transition step, in accordance with the present invention.

In FIG. 1b, the switching from the first contact 3a to the second contact 3b has started by opening the first circuit breaker 5a, forcing the load current $I_L$ to pass through the second branch 4b and generating heat in the resistor R.

Figure 1C:
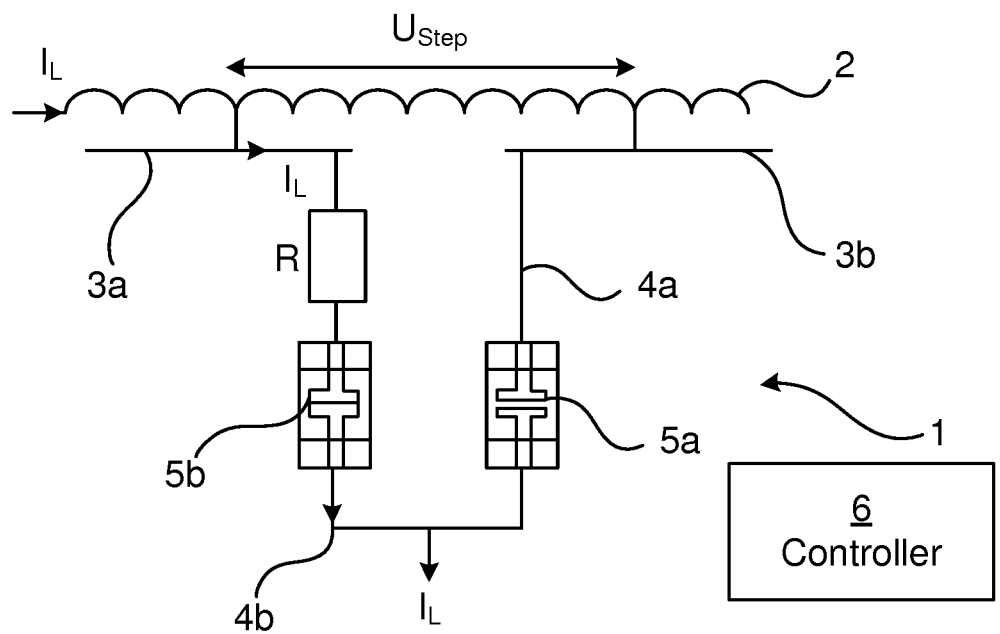
FIG. 1c is a schematic circuit diagram of the embodiment of a tap changer in a third transition step, in accordance with the present invention.

FIG. 1c illustrates how the tap changer has moved such that the first branch 4a is now connected to the second contact 3b. However, the first circuit breaker 5a is still open while the load current $I_L$ continues to pass via the second branch 4b, generating further heat in the resistor R, and the second branch 4b still being connected to the first contact 3a.

Figure 1D:
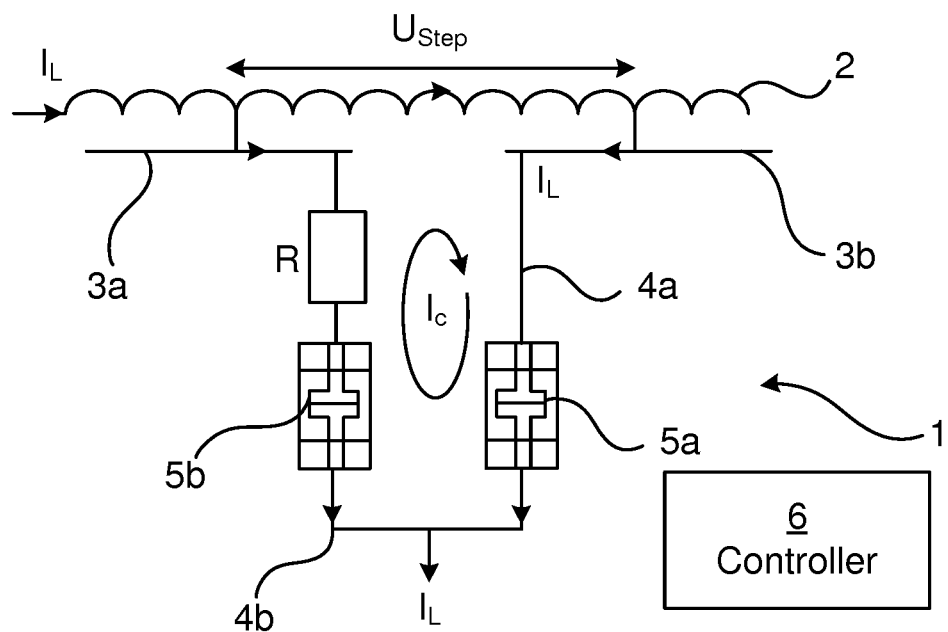
FIG. 1d is a schematic circuit diagram of the embodiment of a tap changer in a fourth transition step, in accordance with the present invention.

As shown in FIG. 1d, the first circuit breaker 5a is then closed, allowing the load current $I_L$ to pass via the first branch 4a, now connected to the second contact 3a with a change in voltage of the transformer corresponding to $U_{step}$. However, the second branch 4b is still connected to the first contact 3a. Due to the step voltage $U_{step}$ now a circulating current $I_c$ is formed that is in the range of the rated current. This circulating current $I_c$ will give rise to heat generation in the resistor R. If only the voltage of the transformer side of the winding 2 is measured at this stage, it may mistakenly be concluded that the tap changer has successfully completed the switch from the first contact 3a to the second contact 3b. However, due to the circulating current $I_c$, heat is still generated in the resistor R which may, in accordance with the present invention, be measured to determine that the switching has not yet completed successfully.

Figure 1E:
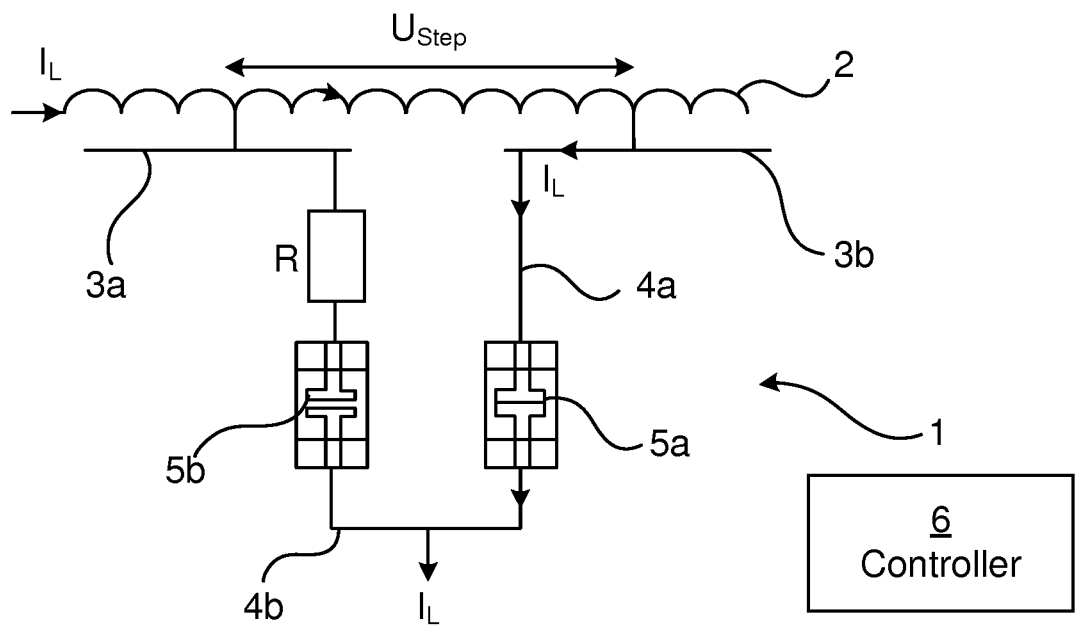
FIG. 1e is a schematic circuit diagram of the embodiment of a tap changer in a fifth transition step, in accordance with the present invention.

In a next step, as shown in FIG. 1e, of successful switching, the second circuit breaker 5b is opened, preventing current from passing through the second branch 4b, and thus stopping the circulating current $I_c$. Since current is no longer passing through the resistor R, less heat is generated, the heat generation of the tap changer typically being again at the same level as for the situation shown in FIG. 1a before the switching operation started. However, if for some reason the second circuit breaker 5b is not properly opened, or there is still arcing in it, some current may still pass through the resistor R, which could be detected as excess heating by means of embodiments of the present invention.

Figure 1F:
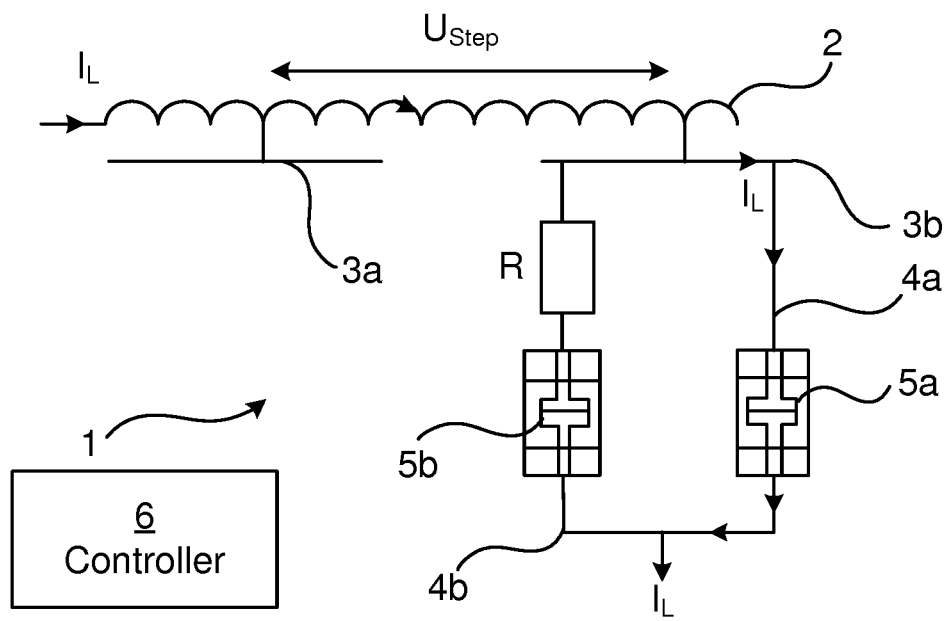
FIG. 1f is a schematic circuit diagram of the embodiment of a tap changer in a sixth transition step, in accordance with the present invention.

In a final switching step shown in FIG. 1f, the tap changer has moved yet further right in the figure, to arrive in the same position as in FIG. 1a but connected to the second contact 3b instead of the first contact 3a, and the switching has been completed. The second circuit breaker 5b may now be closed again and in regular operation no significant current should anyway pass through the second branch 4b thanks to the resistor R thereof. Again, if there is a fault that leads to current passing the second branch 4b, this may be detected as excess heating by means of embodiments of the present invention.

The transformer may have any number of alternating current (AC) phases, why the discussion herein relating to one phase is also relevant to further phases. Typically, the transformer may be for three phases.

Figure 2A:
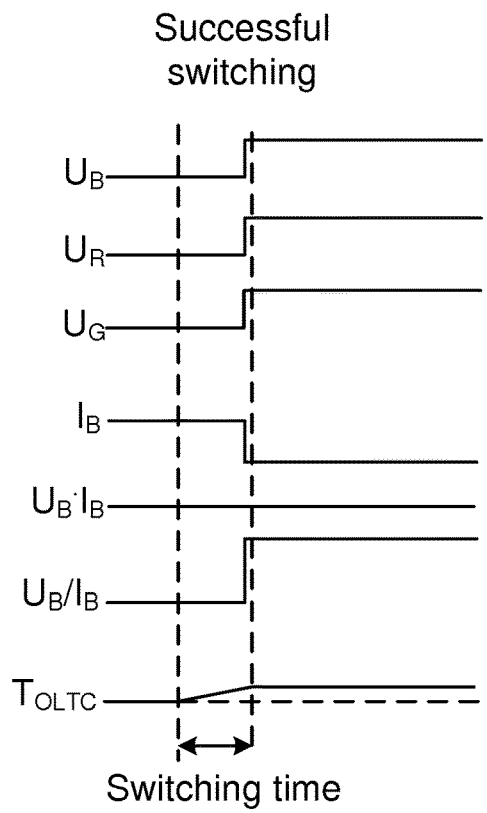
FIG. 2a is a schematic diagram of graphs illustrating an embodiment of successful switching, in accordance with the present invention.
Figure 2B:
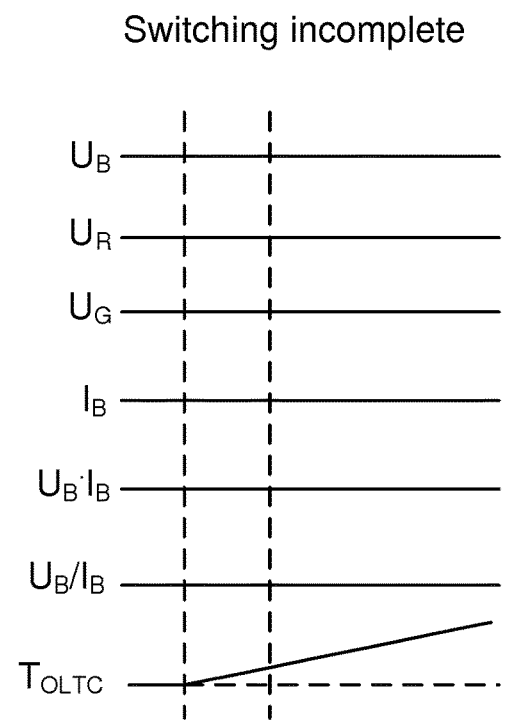
FIG. 2b is a schematic diagram of graphs illustrating an embodiment of incomplete switching, in accordance with the present invention.
Figure 2C:
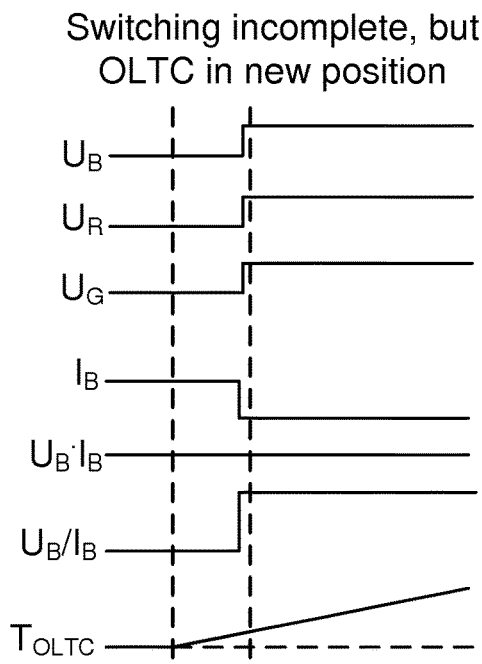
FIG. 2c is a schematic diagram of graphs illustrating another embodiment of incomplete switching, in accordance with the present invention.

FIGS. 2a-2c illustrate some measured and calculated parameters and how they change during a switching from the first contact 3a to the second contact 3b for different cases in a three-phase transformer. The voltages and currents of the phases are often measured for conventional transformers, while no additional voltage or current sensors may need to be installed to perform embodiments of the present invention. To measure the current(s) is optional but preferred in order to obtain more information and avoid misinterpretation of the voltage measurement(s). It may be advantageous to calculate the quotient (U/I) between the measured voltage and the measured current of each phase, to achieve a larger shift and thus reduce the risk of misinterpretation. Further, the product (UI) of the measured voltage and the measured current of each phase should typically be substantially constant and this may also be determined in order to reduce the risk of misinterpretation. If the product shifts substantially, something else may be wrong.

In FIG. 2a, successful switching is illustrated. As can be seen, the switching results in markedly increased voltages $U_B$, $U_R$, $U_G$, for each of the phases B, R and G. In this example, also the current is measured, typically for each phase but here only the current $I_B$ of phase B is shown. By also measuring the current, more complete information about the switching can be obtained. As expected, the current decreases as a result of the switching (since the corresponding voltage increased). It is also possible to relate the current to the corresponding voltage such that a more distinct change may be observed, e.g., by (as shown in the FIGS. 2a-c) dividing voltage $U_B$ with its corresponding current $I_B$ to obtain a larger change resulting from the switching. It may thus be easier to detect a successful switching by looking at the quotient of the voltage and the current than by looking at only the current and/or the voltage.

In some embodiments of the present invention, the determining whether the switching from the first contact to the second contact has been successful may thus comprise determining that a change in measured voltage, current and/or a quotient between the measured voltage and the measured current is above a predetermined threshold.

Since the switching of FIG. 2a was successful, only a small change of the tap changer temperature $T_{OLTC}$ occurs (cf. the steps of FIGS. 1b-d discussed above). Since the change in temperature is below a predetermined threshold, the temperature change does not indicate a fault. Thus, in some embodiments of the present invention, the determining whether the switching from the first contact to the second contact has been successful may comprise determining that the measured temperature has not changed, or that it has changed but that the change is below a predetermined threshold.

In contrast, FIG. 2b illustrates a situation when the switching is unsuccessful. As can be seen, there is no change in voltage or current, indicating that the winding 2 is still connected via the first contact 3a. At the same time, the fact that the temperature $T_{OLTC}$ continues to rise after the end of the switching time period indicates that current passes through the second branch 4b and a fault has occurred (possibly, the tap changer 1 has gotten stuck in any of the steps illustrated in FIG. 1b or 1c). By detecting the fault both by means of measuring the voltage of the transformer and by measuring the temperature of the tap changer that a fault has occurred can be determined with higher certainty, reducing the risk of tripping the transformer unnecessarily.

In some embodiments of the present invention, the determining whether the switching from the first contact to the second contact has been successful may thus comprise determining that a change in measured voltage, current and/or a quotient between the measured voltage and the measured current is below a predetermined threshold.

Further, in some embodiments of the present invention, the determining whether the switching from the first contact to the second contact has been successful may comprise determining that the measured temperature has changed and that the change is above a predetermined threshold.

In some embodiments of the present invention, the determining whether the switching from the first contact to the second contact has been successful may comprise determining that the switching has not been successful, whereby the method further comprises tripping the transformer (disconnecting it from the current).

FIG. 2c illustrates a situation where the voltage and current measurements indicate that the switch has occurred from the first contact 3a to the second contact 3b, but where the temperature continues to rise after the end of the switching time period. This may correspond to the tap changer 1 having gotten stuck in the step illustrated in FIG. 1d. In this case, a fault has occurred but it may not have been detected if only the measured voltage and/or current was considered. It will however be detected by means of the present invention which also considers the measured temperature in the tap changer.

It may also be possible to determine that a switching operation takes too long of a time, or has not been fully completed, if the measured temperature rises above what would be expected for successful switching but not enough to trigger tripping of the transformer. This may e.g., indicate that the tap changer is functional but needs service, or that something else is wrong.

Figure 3:
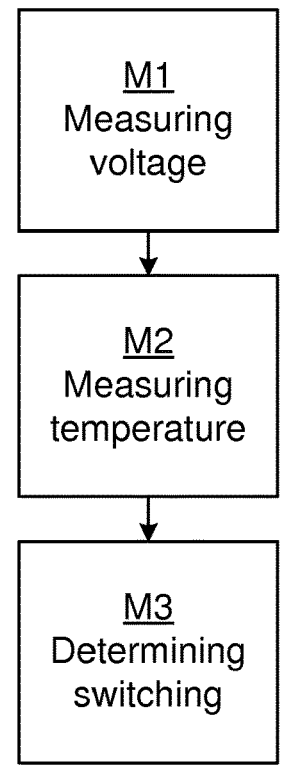
FIG. 3 is a schematic flow chart of an embodiment of the method of the present invention.

FIG. 3 is a flow chart which illustrates embodiments of the method of the present invention. The method is for monitoring switching by a tap changer, typically an OLTC, 1 from a first contact 3a to a second contact 3b of a transformer winding 2.

The method comprises measuring M1 a voltage of the transformer. The voltage may be measured in a conventional way or indirectly by measuring the voltage over the condenser core in a bushing of the transformer. The bushing may pass through a wall of a tank containing the winding 2 of the transformer, which tank may be filled with an electrically insulating fluid, e.g., a liquid such as a mineral or vegetable oil or an ester liquid, which may also function as a cooling fluid. The measuring M1 of a voltage may comprise measuring a voltage for each phase of a three-phase transformer.

The method also comprises measuring M2 a temperature of the tap changer 1. The temperature may e.g., be measured by means of a sensor located in the tap changer. The temperature may be a temperature of insulation fluid such as liquid, e.g., oil, in the tap changer.

The method also comprises, based on the measured M1 & M2 voltage and temperature, determining M3 whether the switching from the first contact 3a to the second contact 3b has been successfully completed.

The method may be performed by the controller 6 discussed herein.

Embodiments of the present invention may be especially useful in high-voltage applications. Thus, in some embodiments of the present invention, the transformer has a voltage rating of at least 1 $kV_{rms}$ (rms=root-mean-square).

Embodiments of the present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a non-transitory storage medium or computer readable medium (media) having instructions stored thereon/in which can be used to program a computer to perform any of the methods/processes of the present invention. Examples of the storage medium can include, but is not limited to, any type of disk including floppy disks, optical discs, DVD, CD-ROMs, Microdrive™, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method of monitoring switching by an on-load tap changer, OLTC, from a first contact to a second contact of a transformer winding during a switching time period, the method comprising:
   measuring (M1) a phase voltage of the transformer over time;
   measuring (M2) a temperature of the OLTC over time;
   based on the measured voltage and temperature, determining (M3) that the switching from the first contact to the second contact has not been successful;
   wherein the determining (M3) includes determining that the measured voltage has changed during the switching time period and that the change is above a predetermined threshold; and
   wherein the determining (M3) includes determining that the measured temperature continues to rise after the end of the switching time period.

2. The method of claim 1, wherein the determining (M3) includes determining that a quotient between the measured phase voltage and a measured current of the same phase has changed during the switching time period and that the change is above a predetermined threshold.

3. The method of claim 1, wherein the method further includes tripping the transformer.

4. The method of claim 1, wherein the measuring (M1) of a voltage includes measuring a voltage at a bushing of the transformer.

5. The method of claim 1, wherein the measuring (M2) of a temperature includes measuring a temperature of insulation liquid, e.g., oil, in the OLTC by means of a temperature sensor located therein.

6. The method of claim 1, wherein the measuring (M1) of a voltage includes measuring a voltage for each phase of a three-phase transformer.

7. The method of claim 1, wherein the OLTC includes a circuit breaker e.g., having a Vacuum Interrupter, VI.

8. The method of claim 1, wherein the transformer has a voltage rating of at least 1 $kV_{rms}$.

9. A computer program product comprising computer-executable components for causing a controller to perform a method of monitoring switching by an on-load tap changer, OLTC, from a first contact to a second contact of a transformer winding during a switching time period, the method including the steps of:
   a method
   measuring (M1) a phase voltage of the transformer over time;
   measuring (M2) a temperature of the OLTC over time;
   based on the measured voltage and temperature, determining (M3) that the switching from the first contact to the second contact has not been successful;
   wherein the determining (M3) includes determining that the measured voltage has changed during the switching time period and that the change is above a predetermined threshold; and
   wherein the determining (M3) includes determining that the measured temperature continues to rise after the end of the switching time period.

10. A controller for monitoring switching by an online tap changer, OLTC, from a first contact to a second contact of a transformer winding during a switching time period, the controller comprising:
    processing circuitry; and
    storage storing instructions executable by said processing circuitry whereby said controller is operative to:
    measure a phase voltage of a transformer over time;
    measure a temperature of an OLTC of the transformer over time;
    based on the measured voltage and temperature, determine that switching from a first contact to a second contact of a winding of the transformer has not been successful;
    wherein the determining includes determining that the measured voltage has changed during the switching time period and that the change is above a predetermined threshold; and
    wherein the determining includes determining that the measured temperature continues to rise after the end of the switching time period.

11. The method of claim 2, wherein the method further includes tripping the transformer.

12. The method of claim 2, wherein the measuring (M1) of a voltage includes measuring a voltage at a bushing of the transformer.

13. The method of claim 2, wherein the measuring (M2) of a temperature includes measuring a temperature of insulation liquid, e.g., oil, in the OLTC by means of a temperature sensor located therein.

14. The method of claim 2, wherein the measuring (M1) of a voltage includes measuring a voltage for each phase of a three-phase transformer.

15. The method of claim 2, wherein the OLTC includes a circuit breaker, e.g., having a Vacuum Interrupter, VI.

16. The method of claim 2, wherein the transformer has a voltage rating of at least 1 $kV_{rms}$.

17. The computer program product of claim 9, including a processing circuit in the controller.

* * * * *